US012563854B2

(12) United States Patent (10) Patent No.: US 12,563,854 B2
Parascandola et al. (45) Date of Patent: Feb. 24, 2026

(54) HETEROEPITAXIAL SEMICONDUCTOR DEVICE AND METHOD FOR FABRICATING A HETEROEPITAXIAL SEMICONDUCTOR DEVICE

(71) Applicant: Infineon Technologies AG, Neubiberg (DE)

(72) Inventors: Stefano Parascandola, Dresden (DE); Dirk Offenberg, Dresden (DE); Boris Binder, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 689 days.

(21) Appl. No.: 18/046,289

(22) Filed: Oct. 13, 2022

(65) Prior Publication Data

US 2023/0123410 A1 Apr. 20, 2023

(30) Foreign Application Priority Data

Oct. 15, 2021 (EP) ..................................... 21202870

(51) Int. Cl.
H10F 39/00 (2025.01)
H10F 30/22 (2025.01)
H10F 71/00 (2025.01)
(52) U.S. Cl.
CPC ........... H10F 39/807 (2025.01); H10F 30/22 (2025.01); H10F 39/014 (2025.01); H10F 39/811 (2025.01); H10F 71/121 (2025.01)
(58) Field of Classification Search
CPC ......... H01L 21/02422; H01L 21/02488; H01L 21/02502; H01L 21/0245; H01L 21/02532; H01L 21/02639; H10F 30/22; H10F 39/014; H10F 39/80; H10F 39/807; H10F 39/811; H10F 71/121
See application file for complete search history.

(56) References Cited

U.S. PATENT DOCUMENTS

2005/0184354 A1 8/2005 Chu et al.
2011/0266595 A1 11/2011 Hata
2017/0301817 A1* 10/2017 Pearson ............ H01L 21/02645
2019/0319055 A1 10/2019 Zaizen et al.

OTHER PUBLICATIONS

Benedikovic et al., Silicon-germanium receivers for short-wave-infrared optoelectronics and communications, Nanophotonics, Jan. 3, 2021, vol. 10, No. 3, pp. 1059-1079.

* cited by examiner

*Primary Examiner* — Andres Munoz
(74) *Attorney, Agent, or Firm* — Harrity & Harrity, LLP

(57) ABSTRACT

A heteroepitaxial semiconductor device includes a bulk semiconductor substrate, a seed layer including a first semiconductor material, the seed layer being arranged at a first side of the bulk semiconductor substrate and including a first side facing the bulk semiconductor substrate, an opposing second side and lateral sides connecting the first and second sides, a separation layer arranged between the bulk semiconductor substrate and the seed layer, a heteroepitaxial structure grown on the second side of the seed layer and including a second semiconductor material, different from the first semiconductor material, and a dielectric material layer arranged on the seed layer and at least partially encapsulating the heteroepitaxial structure, wherein the dielectric material layer also covers the lateral sides of the seed layer.

17 Claims, 5 Drawing Sheets

100

122  140  150

123
111
123
120
113  130
110
112  113

121

140 { 142
141 }

152
151 } 150

120

122

300

310  320  330

120_1  120  120_2

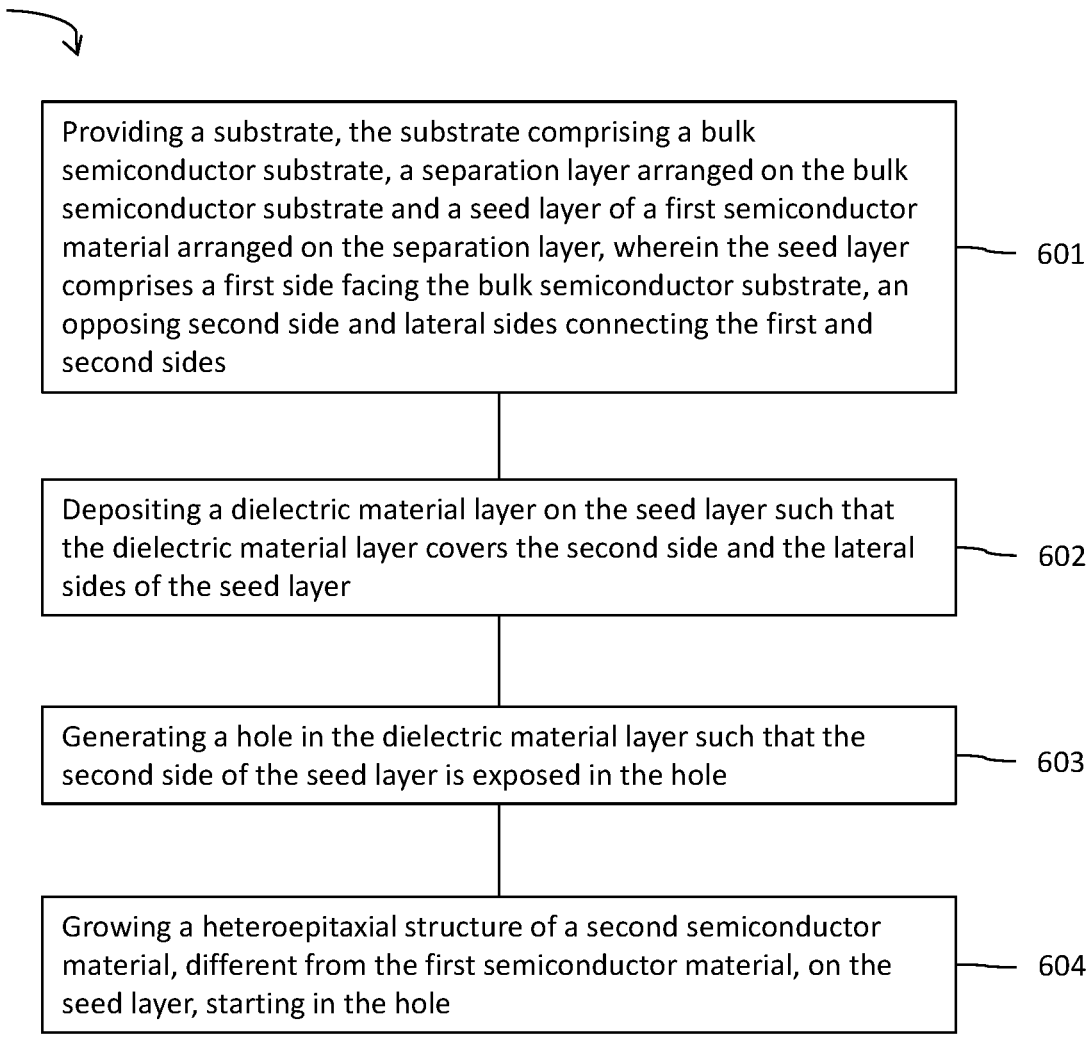

600

Providing a substrate, the substrate comprising a bulk semiconductor substrate, a separation layer arranged on the bulk semiconductor substrate and a seed layer of a first semiconductor material arranged on the separation layer, wherein the seed layer comprises a first side facing the bulk semiconductor substrate, an opposing second side and lateral sides connecting the first and second sides — 601

Depositing a dielectric material layer on the seed layer such that the dielectric material layer covers the second side and the lateral sides of the seed layer — 602

Generating a hole in the dielectric material layer such that the second side of the seed layer is exposed in the hole — 603

Growing a heteroepitaxial structure of a second semiconductor material, different from the first semiconductor material, on the seed layer, starting in the hole — 604

Fig. 6

HETEROEPITAXIAL SEMICONDUCTOR DEVICE AND METHOD FOR FABRICATING A HETEROEPITAXIAL SEMICONDUCTOR DEVICE

CROSS REFERENCE TO RELATED APPLICATION

This application claims priority to European Patent Application No. 21202870 filed on Oct. 15, 2021, the content of which is incorporated by reference herein in its entirety.

TECHNICAL FIELD

This disclosure relates in general to a heteroepitaxial semiconductor device, for example to a heteroepitaxial semiconductor device which may be used in an image sensor, as well as to a method for fabricating the same.

BACKGROUND

A heteroepitaxial semiconductor device comprises a seed layer and a structure epitaxially grown on the seed layer, wherein the seed layer and the structure are comprised of different semiconductor compounds. For example, a germanium (Ge) layer may be epitaxially grown on a silicon (Si) seed layer. The two different semiconductor compounds may have similar lattice constants and/or thermal expansion coefficients. It may be desirable to fabricate heteroepitaxial layers of a particularly large size and/or with particularly few crystal defects. However, dislocations which may originate from the boundary between the seed layer and the heteroepitaxial layer may set an upper limit for the size and/or the flawlessness of the crystal structure of the heteroepitaxial layer. Improved heteroepitaxial semiconductor devices and improved methods for fabricating heteroepitaxial semiconductor devices may reduce or even eliminate these dislocations and may also provide further benefits.

The problem on which the implementation is based is solved by the features of the independent claims. Further advantageous examples are described in the dependent claims.

SUMMARY

Various aspects pertain to a heteroepitaxial semiconductor device, including: a bulk semiconductor substrate, a seed layer including a first semiconductor material, the seed layer being arranged at a first side of the bulk semiconductor substrate and including a first side facing the bulk semiconductor substrate, an opposing second side and lateral sides connecting the first and second sides, a separation layer arranged between the bulk semiconductor substrate and the seed layer, a heteroepitaxial structure grown on the second side of the seed layer and including a second semiconductor material, different from the first semiconductor material, and a dielectric material layer arranged on the seed layer and at least partially encapsulating the heteroepitaxial structure, wherein the dielectric material layer also covers the lateral sides of the seed layer.

Various aspects pertain to a method for fabricating a heteroepitaxial semiconductor device, the method including: providing a substrate, the substrate including a bulk semiconductor substrate, a separation layer arranged on the bulk semiconductor substrate and a seed layer of a first semiconductor material arranged on the separation layer, wherein the seed layer includes a first side facing the bulk semiconductor substrate, an opposing second side and lateral sides connecting the first and second sides, depositing a dielectric material layer on the seed layer such that the dielectric material layer covers the second side and the lateral sides of the seed layer, generating a hole in the dielectric material layer such that the second side of the seed layer is exposed in the hole, and growing a heteroepitaxial structure of a second semiconductor material, different from the first semiconductor material, on the seed layer, starting in the hole.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

FIG. 6 is a flow chart of an example method for fabricating heteroepitaxial semiconductor devices.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". Also, the term "example" is merely meant as an example, rather than the best or optimal.

In several examples layers or layer stacks are applied to one another or materials are applied or deposited onto layers. It should be appreciated that any such terms as "applied" or "deposited" are meant to cover literally all kinds and techniques of applying layers onto each other.

An efficient heteroepitaxial semiconductor device may for example reduce material consumption, ohmic losses, chemical waste etc. and may thus enable energy and/or resource savings. Improved heteroepitaxial semiconductor device, as specified in this description, may thus at least indirectly contribute to green technology solutions, e.g., climate-friendly solutions providing a mitigation of energy and/or resource use.

Figure 1:
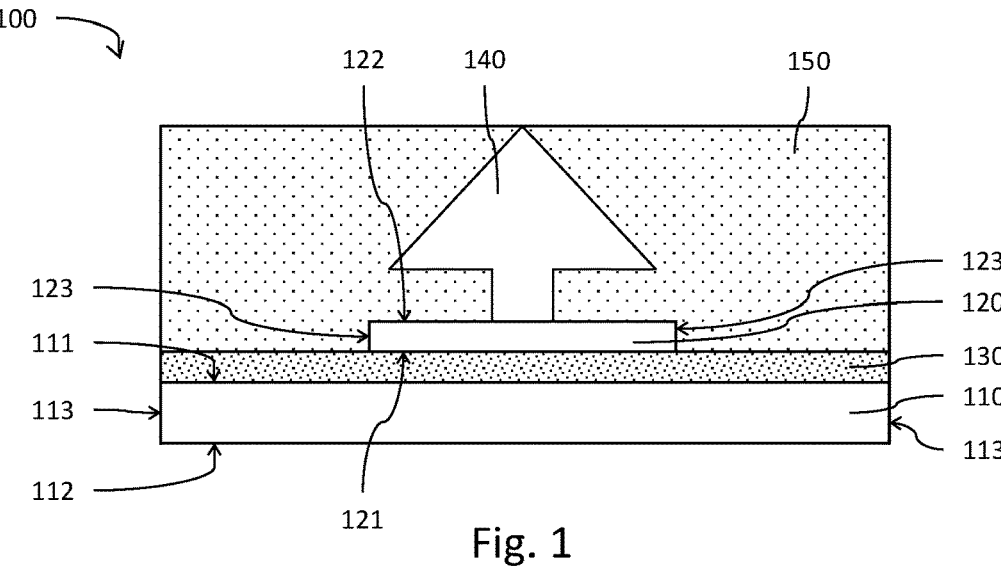
FIG. 1 is a sectional view of a heteroepitaxial semiconductor device, wherein a dielectric material layer encapsulates lateral sides of a seed layer.

FIG. 1 shows a heteroepitaxial semiconductor device 100 which comprises a bulk semiconductor substrate 110, a seed layer 120, a separation layer 130, a heteroepitaxial structure 140 and a dielectric material layer 150.

The seed layer 120 comprises or consists of a first semiconductor material. The seed layer 120 may be a crystalline seed layer. The seed layer 120 is arranged at a first side 111 of the bulk semiconductor substrate 110 such that a first side 121 of the seed layer 120 faces the bulk semiconductor substrate 110 and an opposing second side 122 faces away from the bulk semiconductor substrate 110. The seed layer 120 furthermore comprises lateral sides 123 connecting the first and second sides 121, 122.

The seed layer 120 may have any suitable dimensions. For example, the seed layer 120 may have a thickness measured between the first and second sides 121, 122 of 1 μm or less, or 500 nm or less, or 100 nm or less, or 50 nm or less, or 20 nm or less, or 10 nm or less. The seed layer 120 may e.g., have a lateral extension measured between opposing lateral sides 123 of 100 μm or less, or 50 μm or less, or 10 μm or less, or 5 μm or less. As shown in FIG. 1, the lateral extension of the seed layer 120 may be larger than a maximum lateral extension of the heteroepitaxial structure 140. However, it is also possible that the lateral extension of the seed layer 120 is smaller than the maximum lateral extension of the heteroepitaxial structure 140 (but still at least as large as the lateral extension of a trunk portion 141 of the heteroepitaxial structure 140). It is also possible that the seed layer 120 has a rectangular shape such that along its longer side it is larger than the heteroepitaxial structure 140 but along its shorter side it is smaller.

As shown in FIG. 1, the lateral sides 123 of the seed layer 120 may be recessed from lateral sides of the heteroepitaxial semiconductor device 100. Minimizing the lateral dimensions of the seed layer 120 in this manner may help with reducing stress and/or dislocations and defects in the heteroepitaxial structure 140. For this reason, a larger heteroepitaxial structure 140 and/or a heteroepitaxial structure 140 with less dislocations and crystal defects may be grown on the seed layer 120 compared to a seed layer with larger lateral dimensions.

The bulk semiconductor substrate 110 may e.g., be a semiconductor wafer or a singulated semiconductor die. The bulk semiconductor substrate 110 may comprise or consist of the first semiconductor material. The bulk semiconductor substrate 110 may comprise a second side 112 opposite the first side 111 and it may comprise lateral sides 113 connecting the first and second sides 111, 112. The lateral sides 113 may for example be cut surfaces or there may be further heteroepitaxial semiconductor devices 100 arranged laterally next to the single device shown in the example of FIG. 1.

The bulk semiconductor substrate 110 may have any suitable dimensions. For example, the bulk semiconductor substrate 110 may have a thickness measured between the first and second sides 111, 112 of 50 μm or more, 100 μm or more, 200 μm or more, 500 μm or more, or 1 μm or more.

The separation layer 130 is arranged between the bulk semiconductor substrate 110 and the seed layer 120. The separation layer 130 may be configured to electrically insulate the seed layer 120 from the bulk semiconductor substrate 110. For this reason, the seed layer 120 may also be termed a "silicon on insulator" (SOI) layer. The separation layer 130 may for example be a dielectric material layer, e.g., an oxide layer ("buried oxide layer"). The buried oxide layer may e.g., be a silicon oxide layer. According to another example, the separation layer 130 may comprise a cavity within the bulk semiconductor substrate, wherein the seed layer 120 is arranged above the cavity. In this case, the seed layer 120 may also be termed a "silicon on nothing" (SON) layer.

The separation layer 130 may have any suitable thickness, for example a thickness of 1 μm or less, or 500 nm or less, or 100 nm or less, or 50 nm or less.

The heteroepitaxial structure 140 is grown on the second side 122 of the seed layer 120 and it comprises or consists of a second semiconductor material, different from the first semiconductor material. The first and second semiconductor materials may be any suitable semiconductor materials. The first and second semiconductor materials may have similar lattice constants and/or similar thermal expansion coefficients. According to an example, the first semiconductor material is Si and the second semiconductor material is Ge.

The heteroepitaxial structure 140 may have any suitable shape and any suitable dimensions. According to an example, the particular shape of the heteroepitaxial structure 140 is a product of self-organization during epitaxial growth. According to an example, methods like aspect ratio trapping (ART) may be used to grow an essentially defect free heteroepitaxial structure 140 of a particular shape.

The dielectric material layer 150 is arranged on the seed layer 120, in particular such that it also (completely) covers the lateral sides 123 of the seed layer 120. The dielectric material layer 150 may completely cover all lateral sides 123 of the seed layer 120. The dielectric material layer 150 at least partially encapsulates the heteroepitaxial structure 140. The dielectric material layer 150 may for example encapsulate all lateral sides of the heteroepitaxial structure 140.

According to an example, the dielectric material layer 150 is an oxide layer. The oxide layer may e.g., comprise an oxide of the first semiconductor material of the seed layer 120 or an oxide of the semiconductor material of the bulk semiconductor substrate 110. The oxide layer may for example comprise a silicon oxide.

Figure 2:
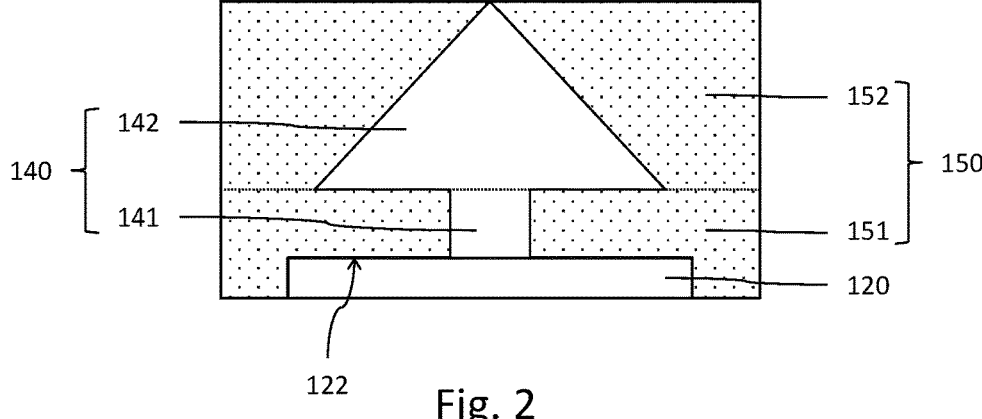
FIG. 2 is a detail view of the heteroepitaxial structure and the seed layer of the device of FIG. 1.

FIG. 2 shows a detail view of the heteroepitaxial structure 140, the seed layer 120 and the dielectric material layer 150 of FIG. 1, according to an example.

According to the example shown in FIG. 2, the heteroepitaxial structure 140 comprises a trunk portion 141 and a top portion 142 arranged on top of the trunk portion 141. Both the trunk portion 141 and the top portion 142 may be part of a contiguous single piece heteroepitaxial structure 140 and may only be distinguished by their different shapes. The trunk portion 141 may be grown directly on the second side 122 of the seed layer 120.

As shown in FIG. 2, the dielectric material layer 150 may comprise a layer stack, for example comprising a lower dielectric material layer 151 and an upper dielectric material layer 152. The trunk portion 141 of the heteroepitaxial structure 140 may be arranged in an aperture in the lower dielectric material layer 151 and the top portion of the heteroepitaxial structure 140 may be arranged in the upper dielectric material layer 152. According to an example, the dielectric material layer 150 may also comprise a (third) bottom dielectric material layer, wherein the laterals sides 123 of the seed layer 120 are covered by the bottom dielectric material layer and the lower dielectric material layer 151 is arranged on the bottom dielectric material layer and covers the second side 122 of the seed layer 120 and the trunk portion 141 of the heteroepitaxial structure 140. The individual layers which form the dielectric material layer 150 may all comprise or consist of the same material or material composition or individual layers may comprise or consist of different materials or material compositions.

The lower dielectric material layer 151 with the aperture may be fabricated on the seed layer 120 prior to growing the heteroepitaxial structure 140, in particular in order to be used for aspect ratio trapping. The heteroepitaxial structure 140 may be grown in the aperture, wherein dislocations in the heteroepitaxial structure 140 are trapped in the aperture in the lower dielectric material layer 151 due to their propagation diagonal to the direction of growth. The heteroepitaxial structure 140, in particular the top portion 142, may therefore be essentially free of crystal dislocations.

In order to trap the dislocations, the trunk portion 141 (or rather the aperture in the lower dielectric material layer 151) may have a high aspect ratio. For example, the trunk portion 141 may have an aspect ratio in the range of 1:1 to 10, for example about 1:2, or 1:4, or 1:6, or 1:8. It is however also possible that a lower aspect ratio is used, for example 2:1, 3:1, 10:1, 30:1, or even 100:1. Generally speaking, the aspect ratio may be anywhere in the range of 100:1 to 1:100. Furthermore, a cross section of the trunk portion 141 as shown in FIG. 2 may essentially have a rectangular shape. In a sectional view onto a plane parallel to the second side 122 of the seed layer, the trunk portion 141 may for example have a circular shape, a quadratic shape or a rectangular shape.

Aspect ratio trapping, as it may, according to an example, be used for fabricating the semiconductor 100, refers to techniques of stopping defects with non-crystalline sidewalls of sufficient height relative to the size of the crystalline growth area. In place of aspect ratio trapping or in addition to it, the approach for fabricating e.g., the semiconductor device 100 disclosed herein may comprise reducing the dislocation density of a lattice mismatched hetero-epitaxial grown material by lattice adaption between the seed layer 120 and the epitaxially grown material (e.g., the heteroepitaxial structure 140), in particular by allowing more lattice adaption in the seed layer 120.

The trunk portion 141 may for example have a lateral extension (a width of the aperture in the lower dielectric material layer 151) of 1 μm or less, or 500 nm or less, or 200 nm or less, or 100 nm or less, or 50 nm or less.

The top portion 142 may for example have a cone shape or pyramid shape as shown in FIG. 2. However, the top portion 142 may for example also have a rectangular shape, an inverse cone shape, etc. According to an example, an upper surface of the top portion 142 is exposed from the dielectric material layer 150, e.g., by use of a chemical mechanical polishing (CMP) process. According to another example, the upper surface of the top portion 142 is covered by the dielectric material layer 150.

A maximum lateral extension of the top portion 142 may for example be 10 μm or less, or 5 μm or less, or 2 μm or less, or 1 μm or less. The top portion 142 may have a height (which may be equal to a thickness of the upper dielectric material layer 152) of for example 2 μm or less, or 1 μm or less, or 500 nm or less, or 200 nm or less.

Fabricating the heteroepitaxial semiconductor device 100 may comprise arranging the lower dielectric material layer 151 on the seed layer 120, fabricating an aperture in the lower dielectric material layer 151, growing the trunk portion 141 in the aperture and the top portion 142 on top of the trunk portion 141 and on top of the lower dielectric material layer 151, and arranging the upper dielectric material layer 152 on top of the lower dielectric material layer 151 and on the top portion 142 of the heteroepitaxial structure 140.

Figure 3:
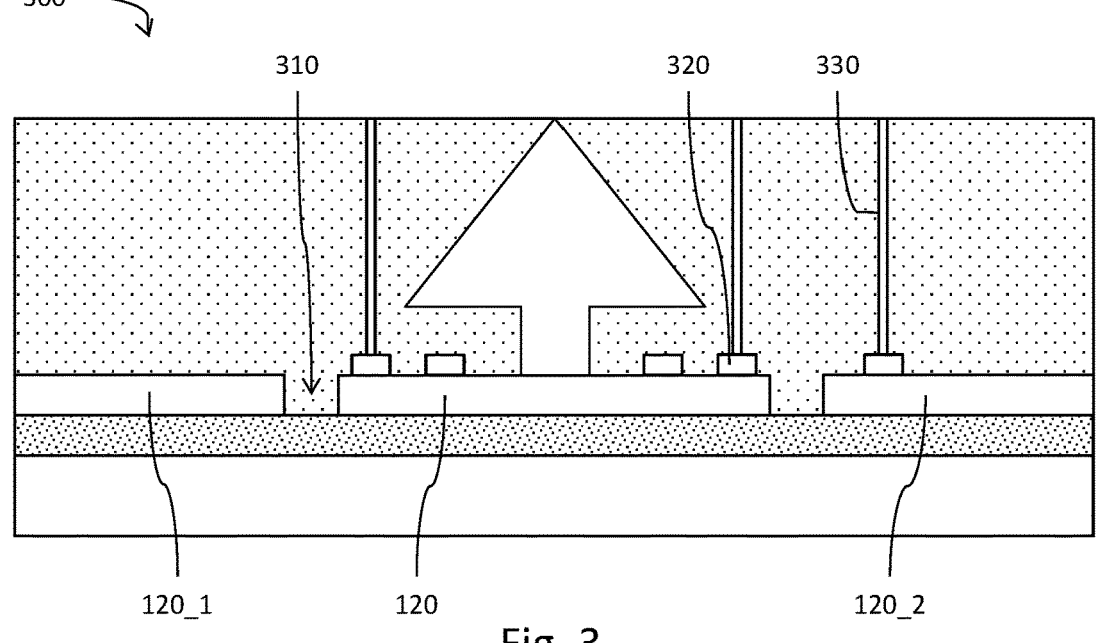
FIG. 3 is a sectional view of a further heteroepitaxial semiconductor device, wherein the seed layer is laterally delimited by a gap filled with dielectric material.

FIG. 3 shows a further heteroepitaxial semiconductor device 300 which may be similar to or identical with the heteroepitaxial semiconductor device 100.

The heteroepitaxial semiconductor device 300 may comprise all parts discussed with respect to FIGS. 1 and 2 and it may additionally comprise further seed layers 120_1 and 120_2 arranged laterally next to the seed layer 120. The seed layer 120 may be separated from the further seed layers 120_1, 120_2 by gaps 310.

The further seed layers 120_1 and 120_2 may have the same dimensions and/or the same material composition as the seed layer 120. According to an example, the seed layer 120 and the further seed layers 120_1, 120_2 are fabricated in the same fabrication process. For example, a single common seed layer may be fabricated on top of the separation layer 130 and afterwards the gaps 310 separating the seed layers 120, 120_1 and 120_2 from each other may be generated. In other words, the seed layers 120, 120_1 and 120_2 may be separate parts of a common seed layer on top of the separation layer 130.

The gaps 310 may be configured to physically and electrically isolate the seed layers 120, 120_1, and 120_2 from each other. The gaps 310 may be filled by the dielectric material layer 150. The gaps 310 may have any suitable dimensions, e.g., a width measured between adjacent one of the seed layers 120, 120_1 and 120_2 of 100 nm or more, 200 nm or more, 500 nm or more, 1 μm or more, or 2 μm or more.

The heteroepitaxial semiconductor device 300 may further comprise one or more transistor or diode structures. The transistor or diode structures may be arranged at the seed layer 120. The transistor or diode structures may comprise poly gates 320 arranged on the seed layer 120. The heteroepitaxial semiconductor device 300 may further comprise contacts 330 configured to electrically contact the poly gates 320. The contacts 330 may be arranged in the dielectric material layer 150, laterally next to the heteroepitaxial structure 140.

The heteroepitaxial semiconductor devices 100 and 300 may be part of any suitable electronic device, for example part of an image sensor. The heteroepitaxial semiconductor devices 100 and 300 may in particular be part of a time of flight image sensor, e.g., a photonic mixing device (PMD).

In the case that the heteroepitaxial semiconductor device 100 or 300 is part of an image sensor, the heteroepitaxial structure 140 may form a photosensitive part of a pixel of the image sensor. An electronic pixel read out part configured to read out the pixel may be arranged laterally next to the heteroepitaxial structure 140. The electronic pixel read out part may e.g., be arranged at the further seed layers 120_1, 120_2. The poly gates 320 arranged on the seed layer may be diode structures that are part of a pixel of an image sensor. The poly gate 320 arranged on the further seed layer 120_2 may be a transistor structure that is part of a pixel read out structure of the image sensor.

Figure 4A:
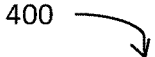
FIGS. 4A and 4B are a sectional view and a top view of a further heteroepitaxial semiconductor device, wherein the seed layer is arranged within a depression in the bulk semiconductor substrate.
Figure 4A:
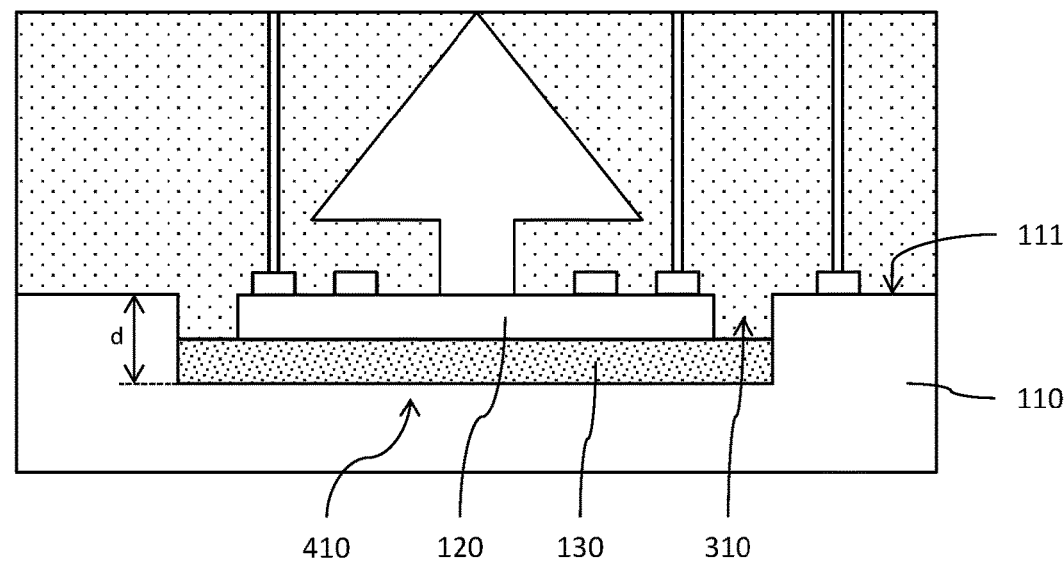
Figure 4B:
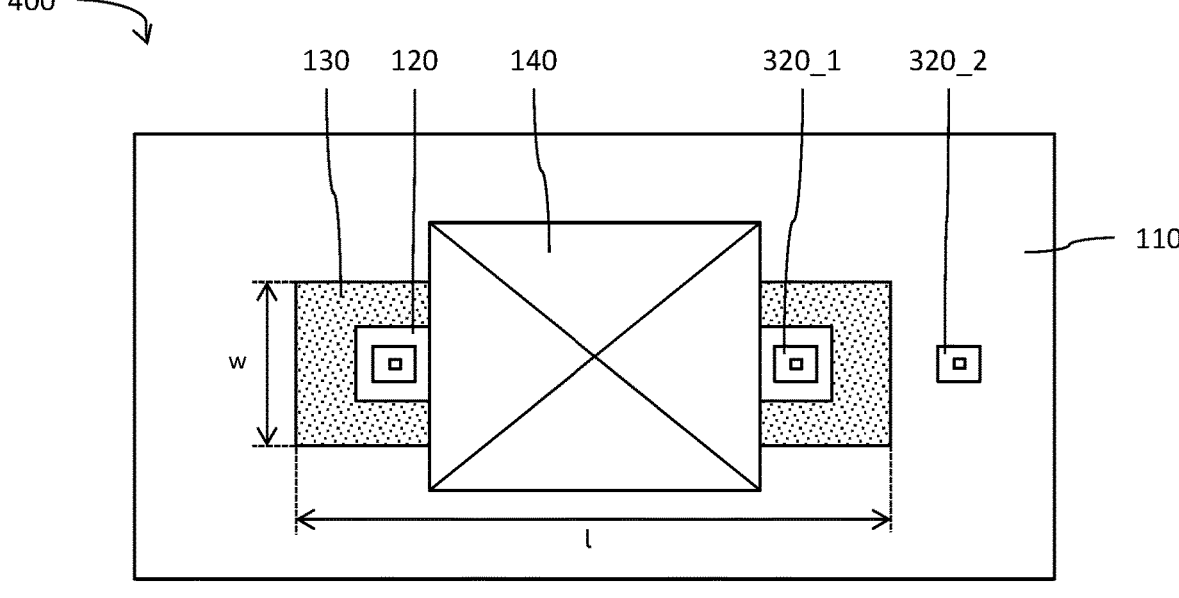

FIGS. 4A and 4B show a further heteroepitaxial semiconductor device 400 which may be similar to or identical with the heteroepitaxial semiconductor device 100 or 300, except for the differences described in the following. FIG. 4A shows a sectional view and FIG. 4B shows a top view.

In the heteroepitaxial semiconductor device 400 the bulk semiconductor substrate 110, in particular the first side 111 of the bulk semiconductor substrate 110, comprises a depression 410 and the separation layer 130 and the seed layer 120 are arranged within the depression 410.

The depression 410 may have any suitable dimensions. For example, the depression 410 may have a depth d that is smaller than or as large as or larger than a combined thickness of the seed layer 120 and the separation layer 130. The depth d may for example be 100 nm or more, or 200 nm or more, or 500 nm or more. According to an example, the depression 410 may have a rectangular shape. A length l of the depression 410 may be larger than a maximum lateral extension of the heteroepitaxial structure 140. The length l may for example be 1 μm or more, or 2 μm or more, or 3 μm or more, or 5 μm or more. A width w of the depression 410 may for example be about no more than half of the length l, or no more than one quarter of the length l. According to another example, the depression 410 has a quadratic shape, a circular shape, etc.

A bottom of the depression 410 may be completely covered by the separation layer 130. The lateral sides 123 of the seed layer 120 may be recessed with respect to lateral sides of the depression 410 such that a gap 310 completely surrounds the seed layer 120 laterally.

According to an example, the heteroepitaxial semiconductor device 400 comprises diode structures 320_1 and transistor structures 320_2, wherein the diode structures 320_1 are arranged at the seed layer 120 and the transistor structures 320_2 are arranged at the first side 111 of the bulk semiconductor substrate 110, laterally next to the depression 410. In the case that the heteroepitaxial semiconductor device 400 is part of an image sensor, the diode structures 320_1 may be part of a pixel and the transistor structures 320_2 may be part of a pixel read out structure.

FIGS. 5A to 5F show the heteroepitaxial semiconductor device 300 in various stages of fabrication, according to an example method for fabricating semiconductor devices. Comparable methods may be used for fabricating the heteroepitaxial semiconductor devices 100 and 400.

Figure 5A:
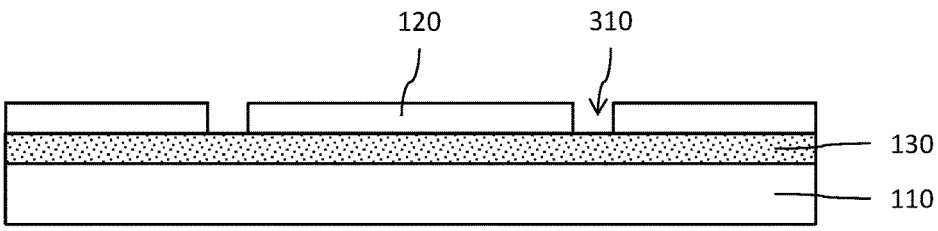
FIGS. 5A to 5F show a heteroepitaxial semiconductor device in various stages of fabrication according to an example method for fabricating heteroepitaxial semiconductor devices.

As shown in FIG. 5A, the bulk semiconductor substrate 110 with the separation layer 130 and the seed layer 120 is provided. The lateral extension of the seed layer 120 is limited by the gap 310 which may completely surround the seed layer 120. The gap 310 may for example be provided by locally removing the seed layer 120 (e.g., by etching) or by fabricating the seed layer 120 on the separation layer 130 in a predefined pattern. Providing the separation layer 130 may comprise generating a buried oxide layer or a cavity in the bulk semiconductor substrate 110.

Figure 5B:
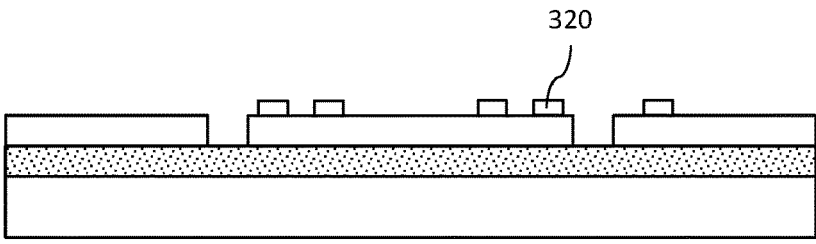

As shown in FIG. 5B, a transistor structure, e.g., of the CMOS type, may be fabricated at the seed layer 120. This may also comprise fabricating the poly gates 320 which may e.g., be configured to provide one or more gates, e.g., separation gates and modulation gates for a pixel of an image sensor, diode contacts, ground contacts, etc.

Figure 5C:
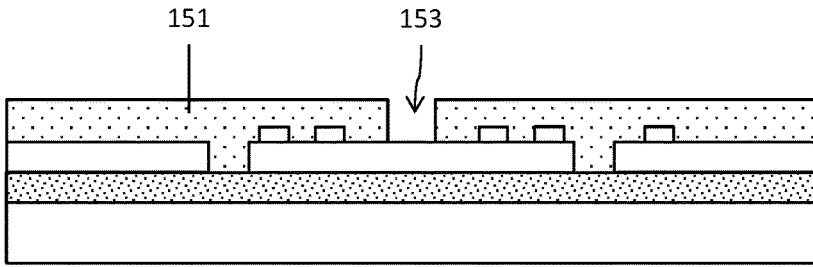

As shown in FIG. 5C, the lower dielectric material layer 151 comprising an aperture 153 is applied on top of the seed layer 120. Providing the aperture 153 may comprise locally removing the dielectric material layer 151.

Figure 5D:
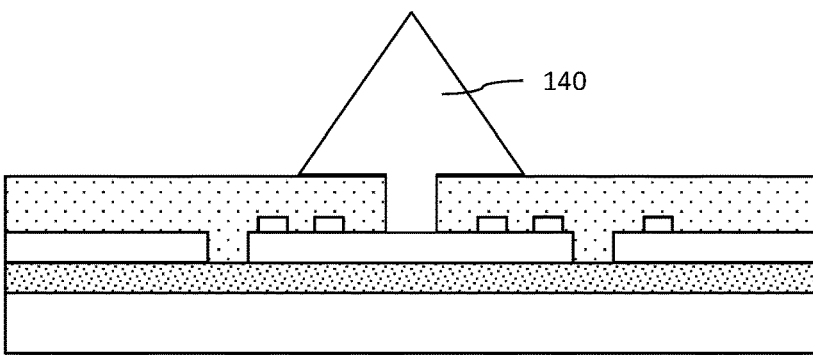

As shown in FIG. 5D, the heteroepitaxial structure 140 is grown on the seed layer 120, beginning in the aperture 153. This may in particular comprise a selective epitaxial growth process. According to an example, the epitaxial growth process may comprise alternating depositing and etching back steps. Dislocations in the crystalline structure of the heteroepitaxial structure 140 are trapped within the aperture. Furthermore, the comparatively small lateral extension of the seed layer 120 and/or its comparatively small thickness may help with reducing stress in the seed layer 120. Thirdly, the comparatively small area of contact between the seed layer 120 and the heteroepitaxial structure 140 (which is due to the narrowness of the aperture 153) may help with minimizing the stress that is induced into the heteroepitaxial structure 140. All these factors may reduce or eliminate dislocations in the heteroepitaxial structure 140.

Figure 5E:
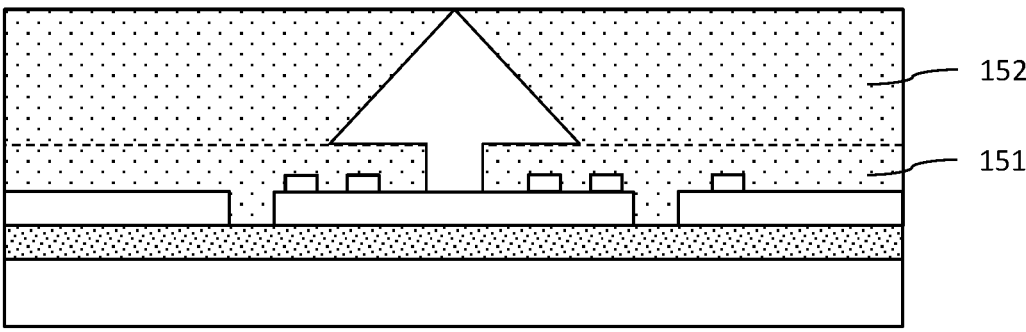

As shown in FIG. 5E, the upper dielectric material layer 152 is applied on top of the lower dielectric material layer 151 and the heteroepitaxial structure 140.

Figure 5F:
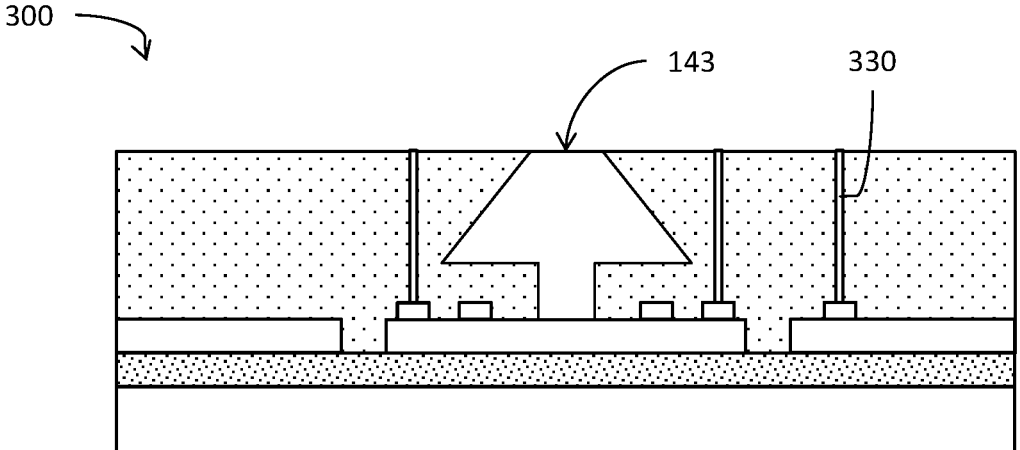

As shown in FIG. 5F, an optional CMP process may be used to expose a flattened top surface 143 of the heteroepitaxial structure 140. Furthermore, the contacts 330 may be fabricated.

FIG. 6 is a flow chart of an example method 600 for fabricating a heteroepitaxial semiconductor device. The method 600 may for example be used for fabricating the heteroepitaxial semiconductor devices 100, 300 and 400.

The method 600 comprises at 601 an act of providing a substrate, the substrate comprising a bulk semiconductor substrate, a separation layer arranged on the bulk semiconductor substrate and a seed layer of a first semiconductor material arranged on the separation layer, wherein the seed layer comprises a first side facing the bulk semiconductor substrate, an opposing second side and lateral sides connecting the first and second sides, at 602 an act of depositing a dielectric material layer on the seed layer such that the dielectric material layer covers the second side and the lateral sides of the seed layer, at 603 an act of generating a hole in the dielectric material layer such that the second side of the seed layer is exposed in the hole, and at 604 an act of growing a heteroepitaxial structure of a second semiconductor material, different from the first semiconductor material, on the seed layer, starting in the hole.

According to an example, the method 600 comprises an optional act of fabricating semiconductor transistor circuitry on the substrate prior to growing the heteroepitaxial structure.

ASPECTS

In the following, the heteroepitaxial semiconductor device and the method for fabricating a heteroepitaxial semiconductor device are further described using specific aspects.

Aspect 1 is a heteroepitaxial semiconductor device, comprising: a bulk semiconductor substrate, a seed layer comprising a first semiconductor material, the seed layer being arranged at a first side of the bulk semiconductor substrate and comprising a first side facing the bulk semiconductor substrate, an opposing second side and lateral sides connecting the first and second sides, a separation layer arranged between the bulk semiconductor substrate and the seed layer, a heteroepitaxial structure grown on the second side of the seed layer and comprising a second semiconductor material, different from the first semiconductor material, and a dielectric material layer arranged on the seed layer and at least partially encapsulating the heteroepitaxial structure, wherein the dielectric material layer also covers the lateral sides of the seed layer.

Aspect 2 is the heteroepitaxial semiconductor device of aspect 1, wherein the heteroepitaxial structure comprises a trunk portion connected to the seed layer and a top portion arranged on top of the trunk portion, wherein a lateral extension of the trunk portion is smaller than a lateral extension of the top portion, the lateral extensions being measured parallel to the second side of the seed layer.

Aspect 3 is the heteroepitaxial semiconductor device of aspect 2, wherein the dielectric material layer comprises a lower dielectric material layer and an upper dielectric material layer, wherein the trunk portion is arranged within the lower dielectric material layer and the top portion is arranged within the upper dielectric material layer.

Aspect 4 is the heteroepitaxial semiconductor device of aspect 2 or 3, wherein the top portion has an essentially pyramidal shape.

Aspect 5 is the heteroepitaxial semiconductor device of one of aspects 2 to 4, wherein the trunk portion has an aspect ratio in the range of 100:1 to 1:100, in particular in the range of 1:1 to 1:10.

Aspect 6 is the heteroepitaxial semiconductor device of one of the preceding aspects, wherein the seed layer has lateral dimensions measured parallel to the second side of the seed layer of 10 µm or less, in particular 5 µm or less.

Aspect 7 is the heteroepitaxial semiconductor device of one of the preceding aspects, wherein the first semiconductor material is Si and the second semiconductor material is Ge.

Aspect 8 is the heteroepitaxial semiconductor device of one of the preceding aspects, wherein the separation layer comprises a buried dielectric material layer or a cavity within the bulk semiconductor substrate.

Aspect 9 is the heteroepitaxial semiconductor device of one of the preceding aspects, wherein the bulk semiconductor substrate comprises a depression and wherein the separation layer and the seed layer are arranged within the depression.

Aspect 10 is an image sensor, comprising: a heteroepitaxial semiconductor device according to one of the preceding aspects, wherein the heteroepitaxial structure forms a photosensitive part of a pixel of the image sensor.

Aspect 11 is the image sensor of aspect 10, wherein the image sensor is a time of flight image sensor comprising a photonic mixer device.

Aspect 12 is the image sensor of aspect 10 or 11, further comprising: an electronic pixel read out part arranged laterally next to the heteroepitaxial semiconductor device and configured to read out the pixel, wherein the read out part comprises a further seed layer arranged coplanar with the seed layer and laterally at a distance from the seed layer.

Aspect 13 is a method for fabricating a heteroepitaxial semiconductor device, the method comprising: providing a substrate, the substrate comprising a bulk semiconductor substrate, a separation layer arranged on the bulk semiconductor substrate and a seed layer of a first semiconductor material arranged on the separation layer, wherein the seed layer comprises a first side facing the bulk semiconductor substrate, an opposing second side and lateral sides connecting the first and second sides, depositing a dielectric material layer on the seed layer such that the dielectric material layer covers the second side and the lateral sides of the seed layer, generating a hole in the dielectric material layer such that the second side of the seed layer is exposed in the hole, and growing a heteroepitaxial structure of a second semiconductor material, different from the first semiconductor material, on the seed layer, starting in the hole.

Aspect 14 is the method of aspect 13, wherein the dielectric material layer comprises a lower dielectric material layer and an upper dielectric material layer, wherein the hole is arranged in the lower dielectric material layer, and wherein the upper dielectric material layer is deposited on the lower dielectric material layer after the heteroepitaxial structure has been grown.

Aspect 15 is the method of aspect 13 or 14, further comprising: fabricating semiconductor transistor circuitry on the substrate prior to growing the heteroepitaxial structure.

Aspect 16 is an apparatus with means for performing the method according to anyone of aspects 13 to 15.

While the disclosure has been illustrated and described with respect to one or more implementations, alterations and/or modifications may be made to the illustrated aspects without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated aspect implementations of the disclosure.

The invention claimed is:

1. A heteroepitaxial semiconductor device, comprising:
a bulk semiconductor substrate;
a seed layer comprising a first semiconductor material, the seed layer being arranged at a first substrate side of the bulk semiconductor substrate, wherein the seed layer comprises a first side facing the bulk semiconductor substrate, a second side arranged opposite to the first side, and lateral sides connecting the first side and the second side;
a separation layer arranged between the bulk semiconductor substrate and the seed layer;
a heteroepitaxial structure grown on the second side of the seed layer and comprising a second semiconductor material that is different from the first semiconductor material; and
a dielectric material layer arranged on the seed layer and at least partially encapsulating the heteroepitaxial structure,
wherein the dielectric material layer covers the lateral sides of the seed layer,
wherein the bulk semiconductor substrate comprises a depression, and
wherein the separation layer and the seed layer are arranged within the depression.

2. The heteroepitaxial semiconductor device of claim 1, wherein the heteroepitaxial structure comprises a trunk portion connected to the seed layer and a top portion arranged on top of the trunk portion, and
wherein a lateral extension of the trunk portion is smaller than a lateral extension of the top portion, wherein the lateral extension of the trunk portion and the lateral extension of the top portion are measured parallel to the second side of the seed layer.

3. The heteroepitaxial semiconductor device of claim 2, wherein the dielectric material layer comprises a lower dielectric material layer and an upper dielectric material layer, and wherein the trunk portion is arranged within the lower dielectric material layer and the top portion is arranged within the upper dielectric material layer.

4. The heteroepitaxial semiconductor device of claim 2, wherein the top portion has an essentially pyramidal shape.

5. The heteroepitaxial semiconductor device of claim 2, wherein the trunk portion has an aspect ratio in a range of 100:1 to 1:100.

6. The heteroepitaxial semiconductor device of claim 2, wherein the trunk portion has an aspect ratio in a range of 1:1 to 1:10.

7. The heteroepitaxial semiconductor device of claim 1, wherein the seed layer has lateral dimensions measured parallel to the second side of the seed layer of 10 μm or less.

8. The heteroepitaxial semiconductor device of claim 1, wherein the first semiconductor material is silicon and the second semiconductor material is germanium.

9. The heteroepitaxial semiconductor device of claim 1, wherein the separation layer comprises a buried dielectric material layer.

10. The heteroepitaxial semiconductor device of claim 1, wherein a gap is defined between the lateral sides of the seed layer and lateral sides of the depression such that the gap completely surrounds the seed layer, laterally.

11. The heteroepitaxial semiconductor device of claim 10, wherein the dielectric material layer is arranged in the gap to electrically isolate the seed layer and the bulk semiconductor substrate.

12. The heteroepitaxial semiconductor device of claim 1, wherein the dielectric material layer is arranged in a gap that laterally separates the seed layer and the bulk semiconductor substrate to electrically isolate the seed layer and the bulk semiconductor substrate.

13. The heteroepitaxial semiconductor device of claim 1, further comprising:

a diode structure arranged on the seed layer; and a transistor structure arranged on the bulk semiconductor substrate, the transistor structure being part of a pixel read out structure.

14. An image sensor, comprising:

a heteroepitaxial semiconductor device comprising:

a bulk semiconductor substrate;

a seed layer comprising a first semiconductor material, the seed layer being arranged at a first substrate side of the bulk semiconductor substrate, wherein the seed layer comprises a first side facing the bulk semiconductor substrate, a second side arranged opposite to the first side, and lateral sides connecting the first side and the second side;

a separation layer arranged between the bulk semiconductor substrate and the seed layer;

a heteroepitaxial structure grown on the second side of the seed layer and comprising a second semiconductor material that is different from the first semiconductor material; and a dielectric material layer arranged on the seed layer and at least partially encapsulating the heteroepitaxial structure, wherein the dielectric material layer covers the lateral sides of the seed layer, wherein the bulk semiconductor substrate comprises a depression, wherein the separation layer and the seed layer are arranged within the depression, and wherein the heteroepitaxial structure forms a photosensitive part of a pixel of the image sensor.

15. The image sensor of claim 14, wherein the image sensor is a time of flight image sensor.

16. An image sensor, comprising:

a bulk semiconductor substrate;

a seed layer comprising a first semiconductor material, the seed layer being arranged at a first substrate side of the bulk semiconductor substrate, wherein the seed layer comprises a first side facing the bulk semiconductor substrate, a second side arranged opposite to the first side, and lateral sides connecting the first side and the second side;

a separation layer arranged between the bulk semiconductor substrate and the seed layer;

a heteroepitaxial structure grown on the second side of the seed layer and comprising a second semiconductor material that is different from the first semiconductor material;

a dielectric material layer arranged on the seed layer and at least partially encapsulating the heteroepitaxial structure, wherein the dielectric material layer covers the lateral sides of the seed layer;

a further seed layer arranged coplanar with the seed layer and arranged laterally at a distance from the seed layer, wherein the first side of the seed layer is coplanar with a first side of the further seed layer, wherein the second side of the seed layer is coplanar with a second side of the further seed layer, and wherein the dielectric material layer is arranged in a gap that laterally separates the seed layer and the further seed layer to electrically isolate the seed layer and the further seed layer;

a diode structure arranged on the seed layer; and a transistor structure arranged on the further seed layer, the transistor structure being part of a pixel read out structure.

17. The image sensor of claim 16, wherein the diode structure includes a first poly gate arranged on the seed layer, and wherein the transistor structure includes a second poly gate arranged on the further seed layer.

* * * * *